(12) United States Patent
Schrems et al.

(10) Patent No.: US 10,256,147 B2
(45) Date of Patent: Apr. 9, 2019

(54) DICING METHOD

(71) Applicant: ams AG, Unterpremstaetten (AT)

(72) Inventors: Martin Schrems, Eggersdorf (AT); Bernhard Stering, Stainz (AT); Franz Schrank, Graz (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/118,836

(22) PCT Filed: Feb. 9, 2015

(86) PCT No.: PCT/EP2015/052645
§ 371 (c)(1),
(2) Date: Aug. 12, 2016

(87) PCT Pub. No.: WO2015/121198
PCT Pub. Date: Aug. 20, 2015

(65) Prior Publication Data
US 2017/0062277 A1    Mar. 2, 2017

(30) Foreign Application Priority Data

Feb. 14, 2014   (EP) .................................... 14155240

(51) Int. Cl.
*H01L 21/78* (2006.01)
*H01L 23/00* (2006.01)
(Continued)

(52) U.S. Cl.
CPC .......... *H01L 21/78* (2013.01); *H01L 21/6835* (2013.01); *H01L 21/76898* (2013.01);
(Continued)

(58) Field of Classification Search
CPC ....... H01L 2924/00; H01L 2924/00014; H01L 2224/32225; H01L 2224/73204; H01L 2224/16225; H01L 2224/48227; H01L 2224/94; H01L 2224/32145; H01L 2224/02372; H01L 21/78; H01L 21/6835; H01L 24/11
See application file for complete search history.

(56) References Cited

U.S. PATENT DOCUMENTS 6,420,776 B1   7/2002   Glenn et al.
6,573,156 B1   6/2003   Wang et al.
(Continued)

FOREIGN PATENT DOCUMENTS

EP       1804287 A2    7/2007
JP    2006114825 A     4/2006
(Continued)

*Primary Examiner* — Jaehwan Oh
*Assistant Examiner* — John M Parker
(74) *Attorney, Agent, or Firm* — Fish & Richardson P.C.

(57) ABSTRACT

The dicing method comprises the steps of providing a substrate (1) of semiconductor material, the substrate having a main surface (10), where integrated components (3) of chips (13) are arranged, and a rear surface (11) opposite the main surface, fastening a first handling wafer above the main surface, thinning the substrate at the rear surface, and forming trenches (20) penetrating the substrate and separating the chips by a single etching step after the substrate has been thinned.

5 Claims, 8 Drawing Sheets

(51) Int. Cl.
*H01L 21/683* (2006.01)
*H01L 21/768* (2006.01)

(52) U.S. Cl.
CPC .... *H01L 24/11* (2013.01); *H01L 2224/02372* (2013.01); *H01L 2224/05569* (2013.01)

(56) References Cited

U.S. PATENT DOCUMENTS

| | | | |
|---|---|---|---|
| 7,482,251 B1 | 1/2009 | Paulsen et al. | |
| 7,566,634 B2 | 7/2009 | Beyne et al. | |
| 8,021,923 B2 | 9/2011 | Do et al. | |
| 8,153,464 B2 | 4/2012 | Montgomery | |
| 8,198,705 B2 | 6/2012 | Mancini et al. | |
| 8,236,611 B1 | 8/2012 | Anderson et al. | |
| 2004/0043615 A1* | 3/2004 | Yamamoto | H01L 21/76898 438/689 |
| 2004/0137700 A1* | 7/2004 | Sekiya | B28D 5/0064 438/460 |
| 2007/0166957 A1* | 7/2007 | Kameyama | H01L 21/76898 438/459 |
| 2008/0070379 A1 | 3/2008 | Kikuchi | |
| 2008/0153265 A1 | 6/2008 | Lyne | |

FOREIGN PATENT DOCUMENTS

| | | |
|---|---|---|
| KR | 20110084829 A | 7/2011 |
| WO | 2011159456 A2 | 12/2011 |
| WO | 2012143353 A1 | 10/2012 |

* cited by examiner

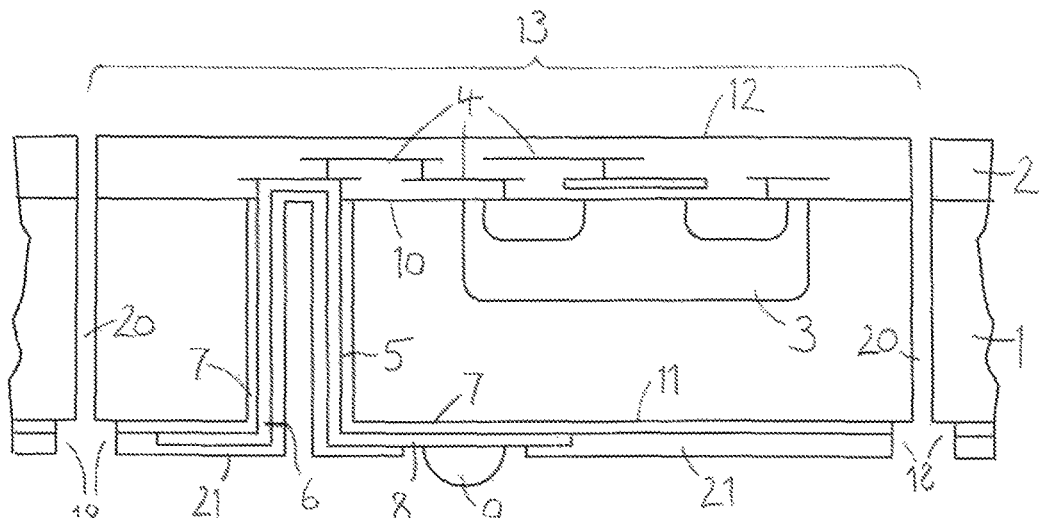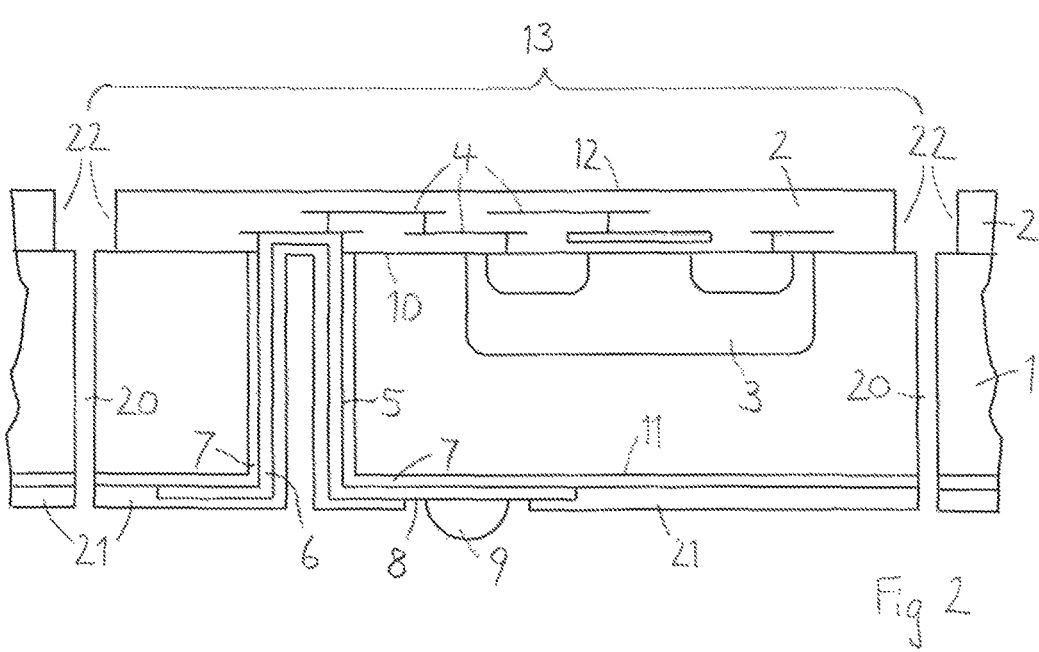

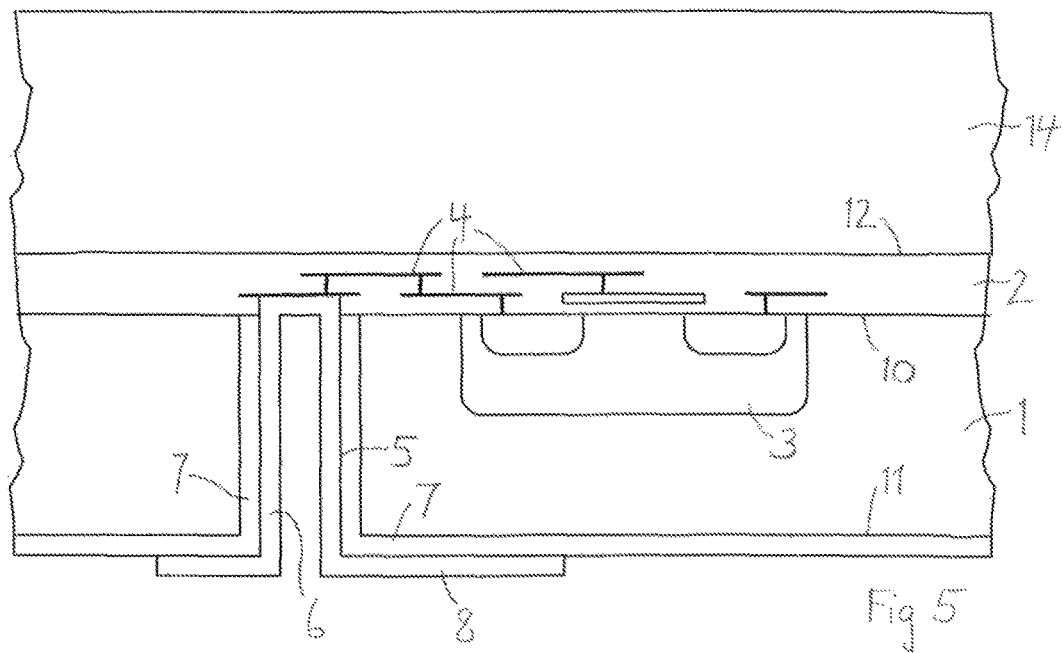
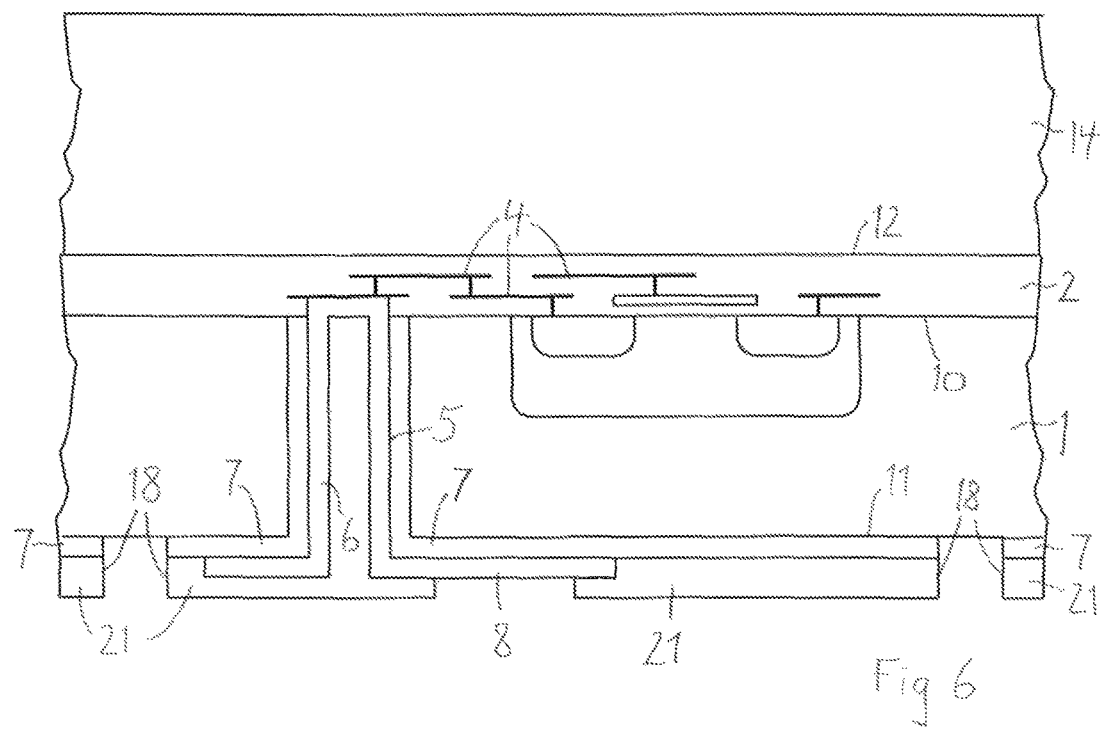

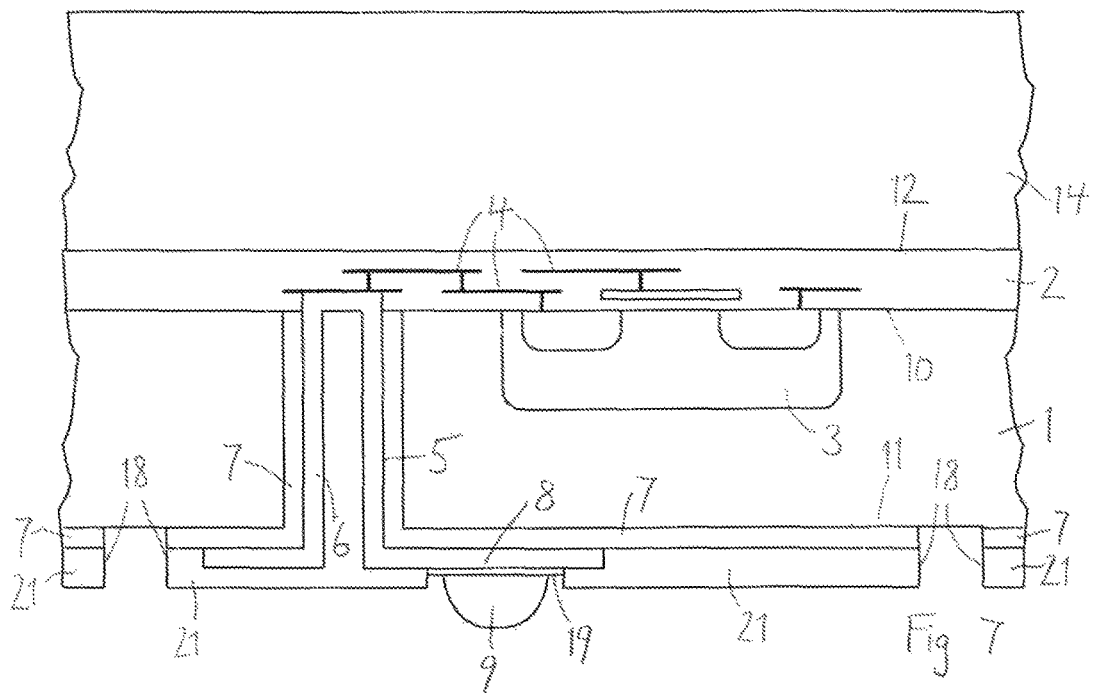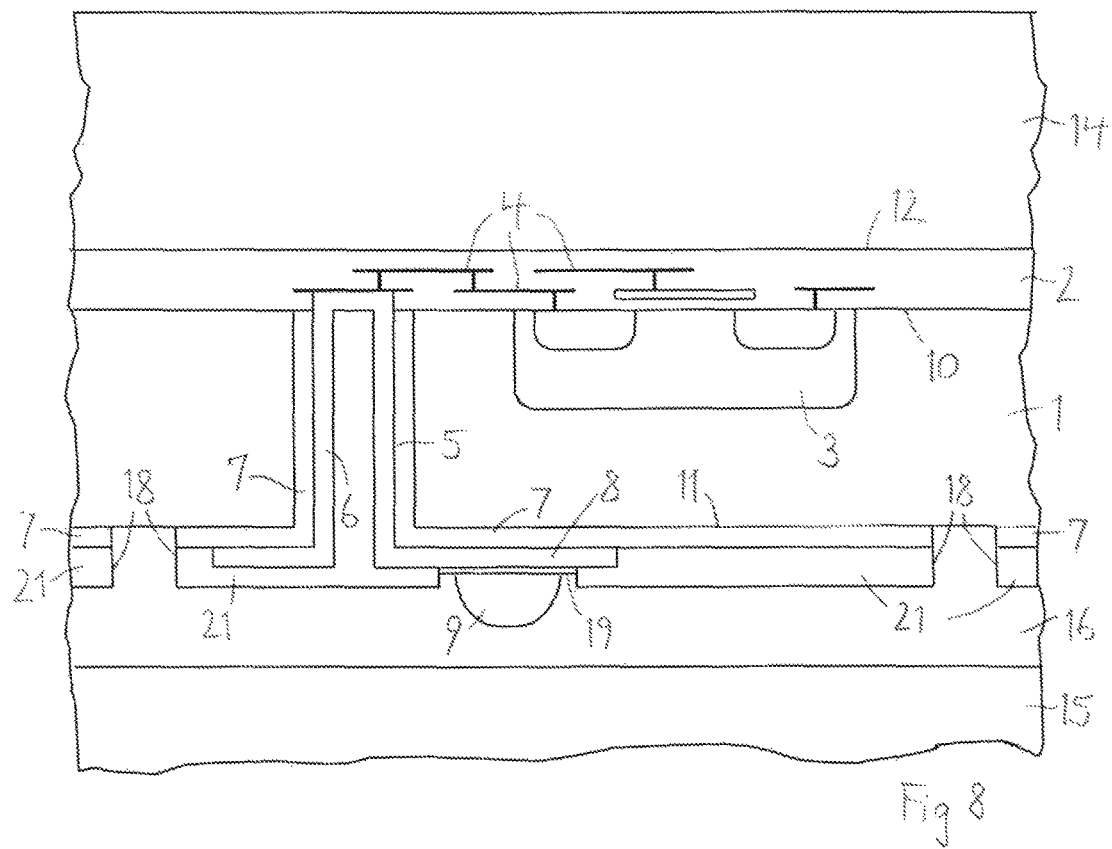

DICING METHOD

BACKGROUND OF THE INVENTION

Semiconductor chips are usually produced on semiconductor wafers, which are conventionally diced into single chips by sawing. Currently known dicing methods also include laser dicing and trench dicing or suitable combinations thereof. These methods are used to divide the wafer along sawing streets surrounding each chip and are part of the packaging process. In case of trench dicing a masking layer is structured by a lithographic process to define the sawing streets. The structured masking layer is then used as a mask in an etching step to produce trenches in the semiconductor wafer along the sawing streets, optionally by deep reactive ion etching (DRIE). Trench dicing has the advantage that the spaces between the chips can be much smaller compared to conventional sawing, and the productivity is higher than in laser dicing. Trench dicing allows the lateral width of the sawing streets to be reduced from typically about 60 µm to 20 µm or even smaller. The smaller the sawing street, the larger is the yield of good die per wafer. Contrary to a sawing method, trench dicing avoids the risk of small pieces breaking off from the chip edges during dicing. Therefore trench dicing is increasingly used for packaging of semiconductor chips.

WO 2011/159456 A2 discloses a semiconductor device including a light-to-heat conversion layer for a wafer support system, which can be used instead of a conventional handling wafer in the manufacturing process for three-dimensional integrated circuits.

WO 2012/143353 A1 discloses a dicing method wherein a trench is formed at a first surface of a carrier comprising electrical components. The carrier is cut through from a second surface opposite the first surface. Thus the material is prevented from breaking out of the carrier during dicing.

U.S. Pat. No. 6,420,776 B1 discloses a method of opening the scribe line at the front side, attaching a holding material such as a tape to silicon dioxide, and then forming groove-type trenches from the backside of wafer opposite the IC by a laser to a desired depth, and finally mechanically cracking the remaining silicon thickness below the scribe line to release the dies.

U.S. Pat. No. 6,573,156 B1 discloses a method for singlation of chips by etching a first trench, filling the trench with a holding material such as parylene, etching a second trench from the backside, removing the holding material by dry etching and releasing the chips.

U.S. Pat. No. 7,482,251 B1 discloses a method of singlation of dies by etching a trench from the top side of the wafer, forming underbump metallization and bumps on the top side and releasing the chips by removing the semiconductor material from the bottom side of the wafer until the trenches are opened.

U.S. Pat. No. 7,566,634 B2 discloses a further method for trench dicing of chips in wafer level packaging (WLP). The substrate is partially divided by etched trenches and afterwards thinned.

U.S. Pat. No. 8,021,923 B2 discloses a method of producing through-hole vias formed along the sawing streets by a partial sawing process to allow stacking of chips. Pads are connected to a via hole formed within organic material such as polyimide within a sawing street that has been partially etched.

U.S. Pat. No. 8,153,464 B2 discloses a method of singulating a semiconductor die from a wafer by etching trenches into the wafer, depositing a passivation layer into the trenches to form a plug on the bottom of the trenches to protect the dies and immobilize them during singulation, and forming a rigid carrier layer or plate at the first side of the wafer to secure the dies. The wafer is then ground from the back side to expose the bottom of each trench. A metal layer is formed on the back surface of the wafer. A dicing tape is added, the carrier layer is removed, and the die is separated from the wafer by laser cutting or by flexing the tape.

U.S. Pat. No. 8,198,705 B2 discloses a method to form trenches along saw streets on the backside of the wafer opposite integrated circuits covered by a glue layer and a handling wafer. The pattern is transferred by DRIE until the glue layer is reached, and the wafer is thus divided into chips.

U.S. Pat. No. 8,236,611 B1 discloses a method for die singulation using a trench etch process from the backside of a die using a first handling wafer. A second handling wafer is attached to the front side comprising integrated components.

US 2008/0153265 A1 discloses a method of die singulation by forming trenches along the sawing streets on the front side and removing the wafer from the backside until the trenches are opened and the die are released.

SUMMARY OF THE INVENTION

The dicing method comprises the steps of providing a substrate of semiconductor material, the substrate having a main surface, where integrated components of chips are arranged, and a rear surface opposite the main surface, fastening a first handling wafer above the main surface, thinning the substrate at the rear surface, and forming trenches penetrating the substrate and separating the chips by a single etching step after the substrate has been thinned.

In a variant of the method, the trenches are etched from the main surface to the rear surface.

In a further variant of the method, a dielectric layer is arranged on or above the rear surface, and openings are formed in the dielectric layer, the trenches being etched to the openings.

In a further variant of the method, a dielectric layer is arranged on or above the main surface, metal layers are arranged in the dielectric layer on or above the main surface, the metal layers being connected to the integrated components, through-substrate vias are formed from the rear surface, the through-substrate vias comprising metallizations connecting the metal layers with rear metal layers on or above the rear surface, and bumps are applied to the rear metal layers, before the trenches are etched.

In a further variant of the method, a second handling wafer is fastened above the rear surface by a connecting layer, and the bumps are embedded in the connecting layer, before the trenches are etched.

In a further variant of the method, the connecting layer is formed by an adhesive.

In a further variant of the method, the trenches are etched from the rear surface to the main surface.

In a further variant of the method, a dielectric layer is arranged on or above the main surface, and openings are formed in the dielectric layer, the trenches being etched to the openings.

In a further variant of the method, metal layers are arranged in the dielectric layer, the metal layers being connected to the integrated components, through-substrate vias are formed from the rear surface, the through-substrate vias comprising metallizations connecting the metal layers with rear metal layers on or above the rear surface, and bumps are applied to the rear metal layers, after the trenches have been etched.

In a further variant of the method, a third handling wafer is fastened above the main surface before the trenches are etched.

In a further variant of the method, the third handling wafer is provided with a sacrificial layer forming an etch stop layer for etching the trenches.

In a further variant of the method, the substrate is thinned to a thickness of less than 100 μm.

The following is a detailed description of examples of the dicing method.

BRIEF DESCRIPTION OF THE DRAWINGS

FIG. 1 is a cross section of an example of a wafer after the application of an example of the dicing method.

FIG. 2 is a cross section of an example of a wafer after the application of a further variant of the dicing method.

FIG. 5 is a cross section according to FIG. 4 after a formation of a through-substrate via and a rear metallization.

FIG. 6 is a cross section according to FIG. 5 after a formation of openings in a rear dielectric layer.

FIG. 7 is a cross section according to FIG. 6 after an application of bumps.

FIG. 8 is a cross section according to FIG. 7 after an application of a further handling wafer.

DETAILED DESCRIPTION

Figure 3:
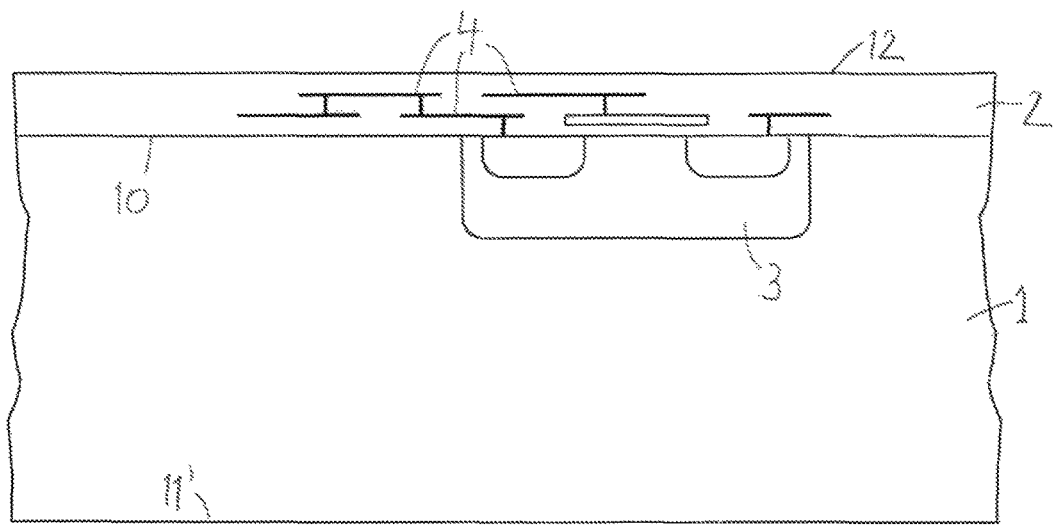
FIG. 3 is a cross section of a wafer comprising integrated components and a wiring.

FIG. 1 is a cross section of an example of a wafer after an example of the dicing method has been applied. The wafer comprises a substrate 1 of semiconductor material like silicon, for instance. A dielectric layer 2 can be arranged in a conventional manner on or above a main surface 10 of the substrate 1. The dielectric layer 2 may be a single layer or a sequence of layers, which may comprise different dielectric materials. The dielectric layer 2 may be silicon dioxide, for instance, and its surface may be formed by a passivation like silicon nitride, for instance. Integrated components 3 like CMOS components, for instance, may be produced at or near the main surface 10. Structured metal layers 4 and interconnections can be embedded in the dielectric layer 2 to form wirings of the integrated components 3. At least one through-substrate via 5 comprising a metallization 6, which may be insulated from the substrate 1 by further dielectric layers 7, may be provided to connect one of the metal layers 4 with a structured rear metal layer 8 at the rear surface 11 of the substrate 1 opposite the main surface 10. Although the method is favorable for dicing wafers comprising through-substrate vias 5, as represented in the appended figures by way of example, the through-substrate vias are optional, and the method can be applied to other devices, which may also comprise sensors, for instance. Bumps 9 may be provided for an external electrical connection of the rear metal layer 8, which may also form a redistribution layer or the like. A further dielectric layer 21 may be applied above the rear surface 11, in particular as a passivation and for planarization.

Trenches 20 are etched in a single etching step for dicing the wafer along scribe lines, which indicate the area where the wafer is to be divided in order to separate the chips 13. The trenches 20 divide the substrate 1. The dielectric layer 2 is opened above the area where the trenches 20 are to be formed. The rear dielectric layers 7, 21 may be provided with openings 18 above the trenches 20, before the trenches 20 are etched. The openings 18 may comprise a larger lateral dimension than the trenches 20. Such openings 18 in the rear dielectric layers 7, 21 are especially advantageous in this variant of the method, which will become clear from the following description.

As the trenches 20 are etched through a thin substrate 1, the scribe lines can be very narrow and the edges of the chips are sufficiently smooth after dicing. As the scribe lines usually form a pattern comprising a first plurality of parallel lines perpendicularly intersected by a second plurality of parallel lines, the trenches 20 typically form one continuous opening in the shape of a rectangular double grid. The trenches 20 are therefore not meant to be individual openings that are separated from one another, but intersecting trenches are included in the patterns that are suitable for an application of this method.

FIG. 2 is a cross section of an example of a wafer after the application of a further variant of the dicing method. The elements of the cross section shown in FIG. 2 that correspond to elements shown in FIG. 1 are designated with the same reference numerals. In the variant according to FIG. 2, openings 22 having a larger lateral dimension than the trenches 20 dividing the substrate 1 are formed in the top dielectric layer 2. The rear dielectric layers 7, 21 are opened above the area where the trenches 20 are to be formed.

FIG. 3 is a cross section of a semiconductor substrate 1 with a main surface 10 and a rear surface 11' opposite the main surface 10. A dielectric layer 2 may be arranged on or above the substrate 1. The dielectric layer 2 comprises a surface 12 opposite the substrate 1. Terminals of integrated components 3, which may be CMOS components, for instance, can be connected by a wiring formed by interconnected structured metal layers 4 embedded in the dielectric layer 2.

Figure 4:
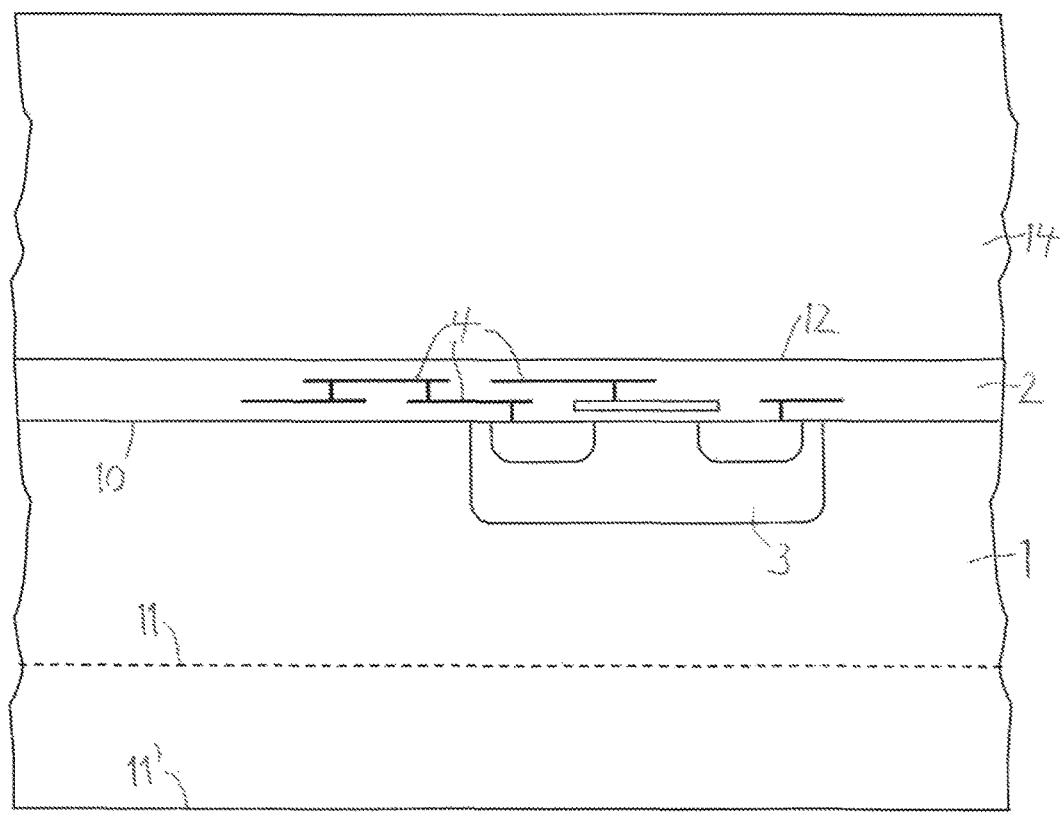
FIG. 4 is a cross section according to FIG. 3 after an application of a handling wafer.

FIG. 4 is a cross section according to FIG. 3 after the application of a first handling wafer 14 on the dielectric layer 2. The elements of the intermediate product shown in FIG. 4 that correspond to elements shown in FIG. 3 are designated with the same reference numerals. The first handling wafer 14 may be bonded directly to the dielectric layer 2, or a connecting or bonding layer, which may be an oxide of the semiconductor material, for instance, can be arranged between the dielectric layer 2 and the first handling wafer 14. The use of a handling wafer and suitable bonding methods are known per se and need not be described here. The substrate 1 is thinned by grinding and/or etching from the rear surface 11' until the final rear surface 11, which is indicated by the broken line in FIG. 4, is reached. A very small thickness of the wafer can thus be achieved, because the wafer is supported by the first handling wafer 14 during the entire thinning process. The thickness of the substrate 1 may be reduced to less than 100 µm, in particular to values within a range of typically 50 µm to 100 µm, for instance.

FIG. 5 is a cross section according to FIG. 4 after the formation of through-substrate vias, which are optional. The elements of the intermediate product shown in FIG. 5 that correspond to elements shown in FIG. 4 are designated with the same reference numerals. The through-substrate vias 5 are formed in openings, which are produced in the substrate 1 from the rear surface 11 to the main surface 10 and through a portion of the dielectric layer 2 towards one of the metal layers 4. Metallizations 6 are arranged in the openings to connect the relevant metal layers 4 with a structured rear metal layer 8, which may be formed together with the metallizations 6 or may instead be applied separately. The metallizations 6 may be insulated from the semiconductor material of the substrate 1 by further dielectric layers 7, which may also be applied on the rear surface 11.

FIG. 6 is a cross section according to FIG. 5 after an application of a further dielectric layer 21 above the rear surface 11. The elements of the intermediate product shown in FIG. 6 that correspond to elements shown in FIG. 5 are designated with the same reference numerals. The dielectric layer 21 may be an oxide of the semiconductor material, for instance, and may be provided as a passivation and/or for planarizing. Openings 18 may be formed in the dielectric layers 7, 21 above the rear surface 11 along the scribe lines, in order to remove the dielectric material completely from the areas of the scribe lines. The lateral width of the openings 18 may be larger than the width of the trenches that are to be formed. The openings 18 may be formed by a dry etch, for instance. Areas of the rear metal layer 8 may also be uncovered for external electric connections.

FIG. 7 is a cross section according to FIG. 6 after an application of bumps 9 on the uncovered areas of the rear metal layer 8. The elements of the intermediate product shown in FIG. 7 that correspond to elements shown in FIG. 6 are designated with the same reference numerals. An underbump metallization 19 may be arranged on the rear metal layer 8 before the bumps 9 are produced. The bumps 9 can be applied on the rear metal layer 8 or on the underbump metallization 19 in a conventional way by a deposition of solder balls with subsequent reflow, for example. During the production of the bumps 9, the openings 18 may be covered.

FIG. 8 is a cross section according to FIG. 7 after an application of a second handling wafer 15. The elements of the intermediate product shown in FIG. 8 that correspond to elements shown in FIG. 7 are designated with the same reference numerals. A connecting layer 16, which may be an adhesive layer, for instance, may be applied to planarize the rear side and to facilitate the bonding of the flat surface of the second handling wafer 15, which may be a glass wafer, for instance. The bumps 9 are embedded in the connecting layer 16, which may also fill the openings 18.

Figure 9:
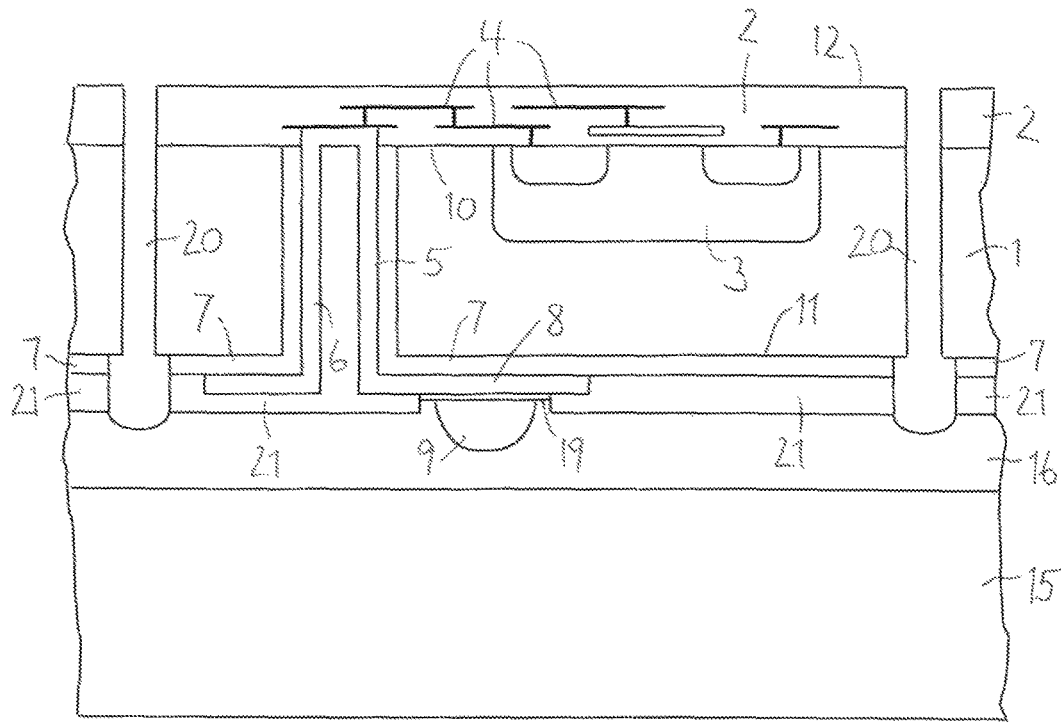
FIG. 9 is a cross section according to FIG. 8 after dicing trenches have been etched.

FIG. 9 is a cross section according to FIG. 8 after the removal of the first handling wafer 14 and after the etching of trenches 20. The elements of the intermediate product shown in FIG. 9 that correspond to elements shown in FIG. 8 are designated with the same reference numerals. The dielectric layer 2 is removed in the area where the trenches are to be etched. For this purpose the dielectric layer 2 can be locally removed by a masked dry etching step, for example. Then the trenches 20 are etched from the main surface 10 through the substrate 1 according to the pattern of scribe lines to the rear surface 11. A mask like a resist mask, for example, which is structured according to the scribe lines by photolithography, for example, can be applied in the etching step. The trenches 20 can be etched according to conventional methods. If the dielectric layer 2 is present, two or more succeeding etching steps can be performed with etching agents and/or etching parameters being adjusted to the different materials of the dielectric layer 2 and the substrate 1. These etching procedures are known per se from semiconductor technology. FIG. 9 shows that the etching process may be stopped when the connecting layer 16 is reached. Alternatively the etching may be continued into the connecting layer 16, in particular until the connecting layer 16 is removed and the second handling wafer 15 is separated from the wafer.

Figure 10:
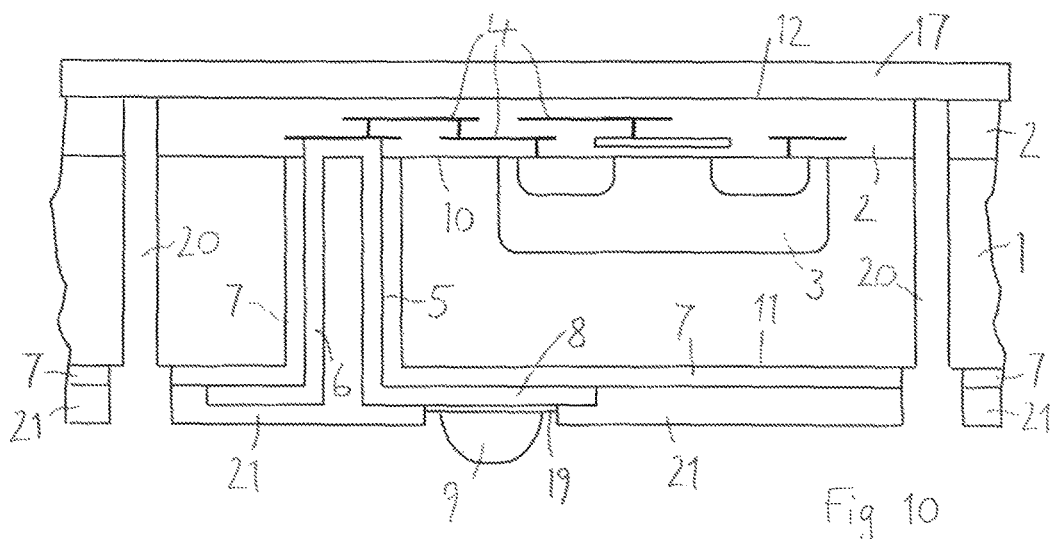
FIG. 10 is a cross section according to FIG. 9 after a removal of the second handling wafer.

FIG. 10 is a cross section according to FIG. 9 after the removal of the second handling wafer 15. The elements of the intermediate product shown in FIG. 10 that correspond to elements shown in FIG. 9 are designated with the same reference numerals. A carrier 17 may be applied to the surface 12 of the top dielectric layer 2, after the trenches 20 have been etched and before the connecting layer 16 and the second handling wafer 15 are removed. The carrier 17 may be an adhesive tape or foil, for instance, and may be provided to hold the chips 13 temporarily after dicing. The second handling wafer 15 can be removed by a laser debonding process like the one described in WO 2011/159456 A2 cited above, for example.

Dicing by trenches that are produced in a single etching step from the top side to the rear side of the wafer after the application of bumps is especially suitable for the production of thin chips. The wafer can thus be thinned to the final thickness that is intended for the chips, and the bumps can be applied, before wafer dicing takes place. The thickness of the chips is therefore no longer limited by wafer handling during the bumping process. In this way a thickness of the chips of less than 50 µm can be obtained, whereas the conventional production method only allows chip thicknesses of typically about 200 µm. The reduced chip thickness is also advantageous for the aspect ratio of the through-substrate vias, which can then be formed with a lateral width of typically about 20 µm, for instance, without substantially changing the further process flow. The lateral width of the scribe lines can also be reduced. As the dicing trenches are etched, the produced chip edges are smooth, and there is no risk of chipping at the edges.

Figure 11:
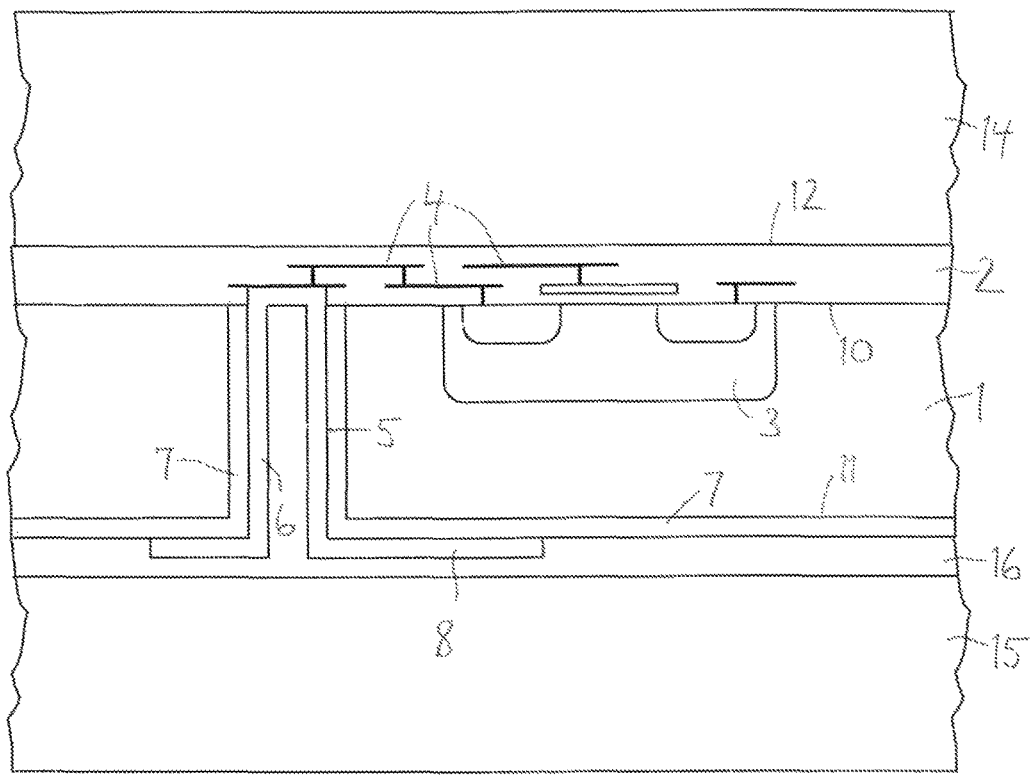
FIG. 11 is a cross section according to FIG. 5 after an application of a further handling wafer.

FIG. 11 is a cross section according to FIG. 5 for a further variant of the method. The elements of the intermediate product shown in FIG. 11 that correspond to elements shown in FIG. 5 are designated with the same reference numerals. FIG. 11 shows an intermediate product after an application of a second handling wafer 15. A connecting layer 16, which may be an oxide of the semiconductor material, for instance, is applied to planarize the rear side and to facilitate the bonding of the flat surface of the second handling wafer 15.

Figure 12:
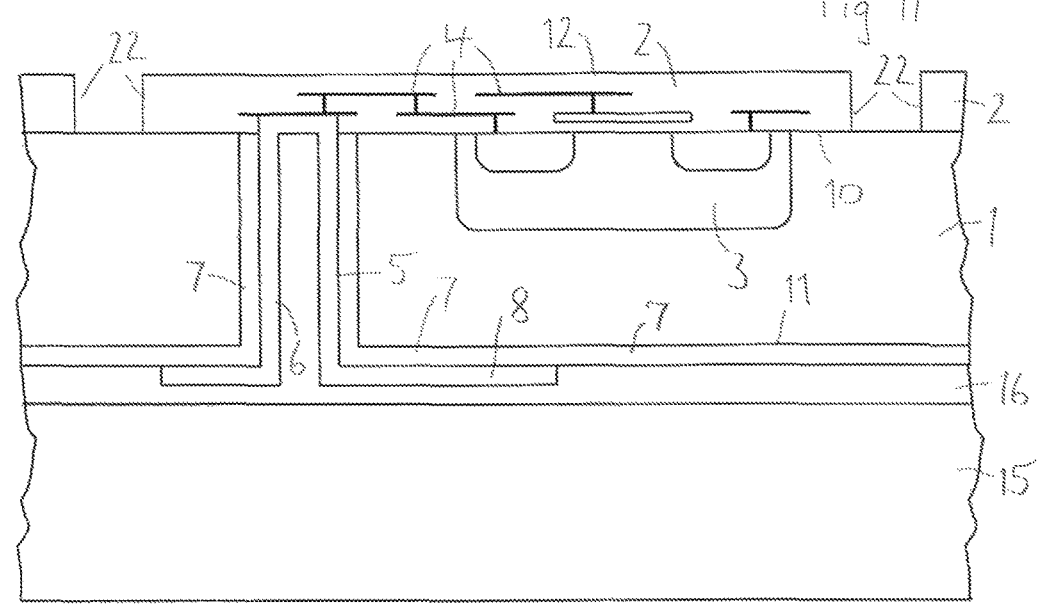
FIG. 12 is a cross section according to FIG. 11 after a formation of openings in the top dielectric layer.

FIG. 12 is a cross section according to FIG. 11 after the first handling wafer 14 has been removed. The elements of the intermediate product shown in FIG. 12 that correspond to elements shown in FIG. 11 are designated with the same reference numerals. Openings 22 may be formed in the top dielectric layer 2 above the main surface 10 along the scribe lines, in order to remove the dielectric material completely from the area of the scribe lines. The lateral width of the openings 22 may be larger than the width of the trenches that are to be formed. The openings 22 may be formed by a dry etch, for instance.

Figure 13:
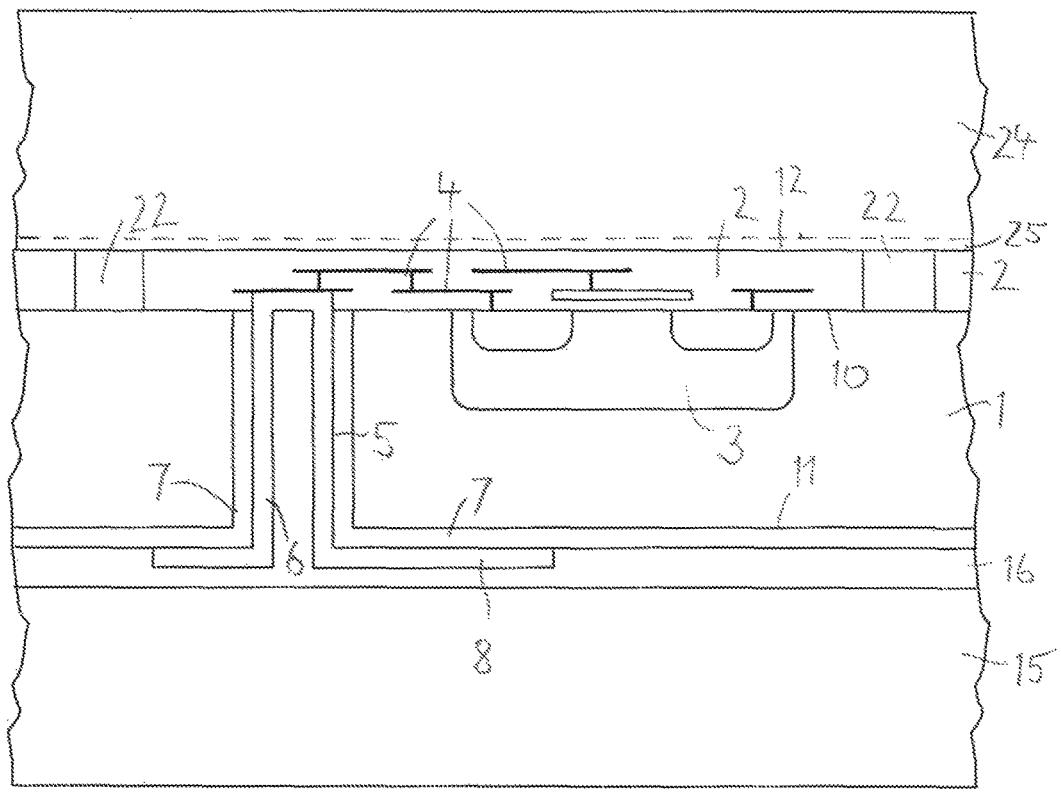
FIG. 13 is a cross section according to FIG. 12 after an application of a third handling wafer.

FIG. 13 is a cross section according to FIG. 12 after an application of a third handling wafer 24 above the main surface 10. The elements of the intermediate product shown in FIG. 13 that correspond to elements shown in FIG. 12 are designated with the same reference numerals. The third handling wafer 24 is bonded to the dielectric layer 2. A sacrificial layer 25, which is indicated with broken lines in FIGS. 13 and 14, may before be arranged on the third handling wafer 24, which is then bonded with the sacrificial layer 25 facing the substrate 1. A connecting or bonding layer, which may be an oxide of the semiconductor material, for instance, can be arranged between the dielectric layer 2 and the third handling wafer 24 or between the dielectric layer 2 and the sacrificial layer 25, respectively, in order to facilitate the bonding process. The openings 22 form voids between the substrate 1 and the third handling wafer 24.

Figure 14:
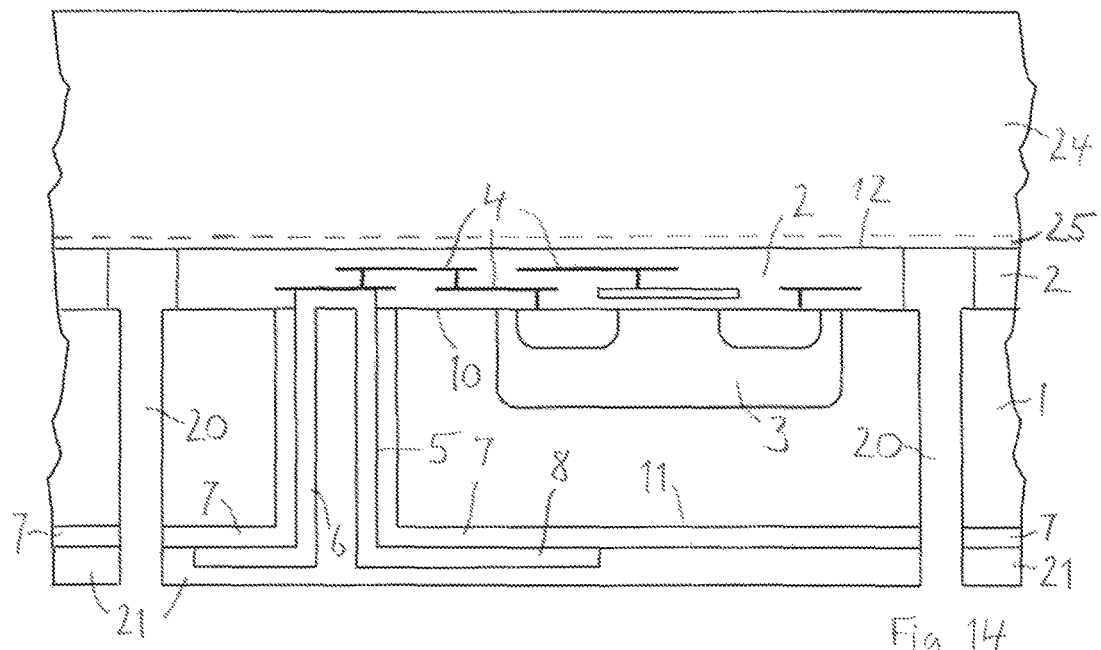
FIG. 14 is a cross section according to FIG. 13 after dicing trenches have been etched.

FIG. 14 is a cross section according to FIG. 13 after the etching of the trenches 20. The elements of the intermediate product shown in FIG. 14 that correspond to elements shown in FIG. 13 are designated with the same reference numerals. After the second handling wafer 15 has been removed, the dielectric layers 7, 21 are opened in the area where the trenches are to be produced. The dielectric layer 21 may be formed by the connecting layer 16, which remains above the rear surface 11 in this case, or by a further layer, which is applied after the connecting layer 16 has been removed. Then the trenches 20 are etched according to the pattern of scribe lines through the substrate 1 until the openings 22 are reached. A mask like a resist mask, which is structured according to the scribe lines by photolithography, for example, can be applied in the etching step. If a sacrificial layer 25 is provided, it is used as an etch stop layer. If no sacrificial layer 25 is provided, etching stops on the third handling wafer 24.

Figure 15:
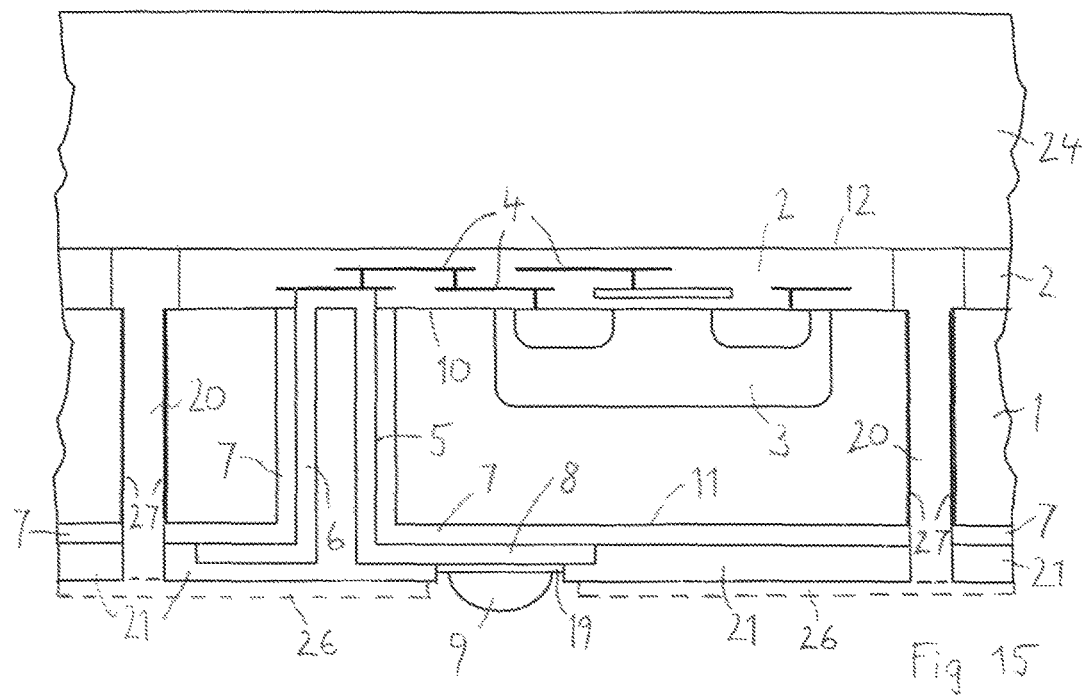
FIG. 15 is a cross section according to FIG. 14 after an application of bumps.

FIG. 15 is a cross section according to FIG. 14 after an application of bumps 9 on uncovered areas of the rear metal layer 8. The elements of the intermediate product shown in FIG. 15 that correspond to elements shown in FIG. 14 are designated with the same reference numerals. An underbump metallization 19 may be arranged on the rear metal layer 8 before the bumps 9 are produced. The trenches 20 are optionally covered during the application of the underbump metallization 19. This can be achieved by a protecting film 26 on the rear side or by a sidewall protection 27 inside the trenches 20. A protecting film 26 can be formed by a photoresist, for example, which can be laminated on the dielectric layer 21, as indicated in FIG. 15 by broken lines. The protecting film 26 is structured to expose the areas where the bumps 9 are to be arranged. After the formation of the bumps 9, the protecting film 26 is removed. A sidewall protection 27 inside the trenches 20 can be formed from an insulating material, especially from an organic material, for instance. Such a sidewall protection 27 can be applied by nanocoating, for example, and can be left there after dicing. A sidewall protection 27 can instead be formed by an oxidation of the semiconductor material at the sidewalls of the trenches 20. The bumps 9 can be applied on the rear metal layer 8 or on the underbump metallization 19 in a conventional way by a deposition of solder balls with subsequent reflow, for example.

Figure 16:
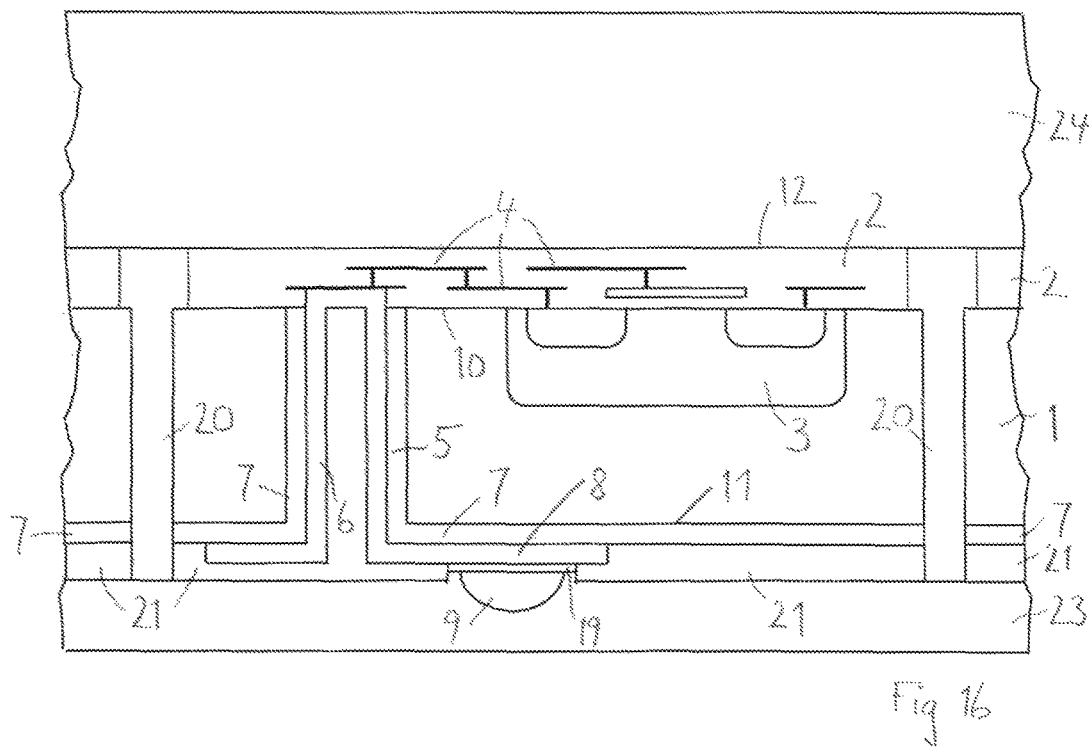
FIG. 16 is a cross section according to FIG. 15 after an application of a carrier.

FIG. 16 is a cross section according to FIG. 15 after an application of a temporary carrier 23 on the rear side. The elements of the intermediate product shown in FIG. 16 that correspond to elements shown in FIG. 15 are designated with the same reference numerals. The third handling wafer 24 can then be removed, and a carrier 17, which may be an adhesive tape or foil, for instance, can be applied to the top side to hold the chips temporarily after dicing, as described above in conjunction with FIG. 10.

The method is especially suitable for the production of chips that are intended for three-dimensional integration, and in particular for the production of chips including through-substrate vias.

The invention claimed is:

1. A dicing method, comprising:
providing a substrate of semiconductor material, the substrate having a main surface where integrated components of chips are arranged, and a rear surface opposite the main surface;
fastening a first handling wafer above the main surface;
thinning the substrate at the rear surface;
arranging a first dielectric layer on or above the rear surface;
forming openings in the first dielectric layer;
forming trenches penetrating the substrate by a single etching step after the substrate is thinned, the trenches being etched from the main surface to the openings in the first dielectric layer to separate the chips into distinct portions, wherein the single etching step is performed by dry etching;
arranging a second dielectric layer on or above the main surface;
arranging metal layers in the second dielectric layer, the metal layers being connected to the integrated components;
forming through-substrate vias from the rear surface, the through-substrate vias comprising metallizations connecting the metal layers with rear metal layers on or above the rear surface; and
applying bumps to the rear metal layers, before the trenches are etched.

2. The dicing method of claim 1, wherein the trenches are etched from the main surface to the rear surface.

3. The dicing method of claim 1, further comprising:
fastening a second handling wafer above the rear surface by a connecting layer; and
embedding the bumps in the connecting layer, before the trenches are etched.

4. The dicing method of claim 3, wherein the connecting layer is formed by an adhesive.

5. The dicing method of claim 1, wherein the trenches are etched from the rear surface to the main surface.

* * * * *